United States Patent [19]
Klank

[11] 3,757,228
[45] Sept. 4, 1973

[54] CIRCUIT FOR AUTOMATIC SEARCH TUNING IN RADIO RECEIVERS

[75] Inventor: Otto Klank, Arpke, Germany

[73] Assignee: Licentia Patent-Verwaltungs-G.m.b.H., Frankfurt am Main, Germany

[22] Filed: Sept. 9, 1971

[21] Appl. No.: 178,875

[30] Foreign Application Priority Data

Sept. 9, 1970 Germany .................. P 20 44 635.9

[52] U.S. Cl. ...................... 325/470, 334/15, 334/16
[51] Int. Cl. ........................................ H04b 1/32
[58] Field of Search .................... 325/468, 469, 422, 325/470; 307/289, 290, 291; 333/17; 334/16

[56] References Cited

UNITED STATES PATENTS 3,644,853 2/1972 Ma ...................................... 334/16
3,560,858 2/1971 Sakai ................................ 325/470
3,519,939 7/1970 Tashima ............................ 325/470

FOREIGN PATENTS OR APPLICATIONS 1,150,145 6/1963 Germany ........................... 307/289

*Primary Examiner*—Robert L. Griffin
*Assistant Examiner*—William S. Moore
*Attorney*—George M. Spencer, Jay M. Finkelstein et al.

[57] ABSTRACT

An automatic tuning circuit for a receiver which has a switch for initiating a search for a station delivering a signal exceeding a threshold level. The circuit is designed to maintain lock-on to such a station even when the received signal momentarily fades. A modification of the circuitry permits reversible tuning across the broadcast band. Fine tuning is achieved by a ratio detector which generates an error signal dependent upon frequency deviation.

6 Claims, 2 Drawing Figures

PATENTED SEP 4 1973

3,757,228

CIRCUIT FOR AUTOMATIC SEARCH TUNING IN RADIO RECEIVERS

BACKGROUND OF THE INVENTION

The present invention relates to automatic tuning of a radio receiver, and more particularly to circuitry for adjusting a variable capacitance diode, in the receiver tuner section, to receive a signal whose value exceeds a threshold level.

A known technique for automatic search tuning in radio receiver circuits employs the voltage of a capacitor to tune variable capacitance diodes in the receiver tuning section. The sawtooth shape of a tuning voltage required for searching is generated by a capacitor which is charged by a high-ohmic resistor or by a transistor with an almost constant current. This charging process is interrupted when a station is received, i.e., when the strength of the received field exceeds a minimum threshold value. At that time a switching transistor in parallel with the charging capacitor begins to discharge the capacitor so that the voltage at the capacitor is kept constant by equal values of charging and discharging current. The searching then ceases and the station is locked-on.

Since the voltage which controls the charging or discharging process is dependent, in the known circuits, on the received field strength, it is possible that the capacitor will be further charged when the field strength decreases thereby causing renewed searching. Thus the locked-on station will no longer be received after the threshold value of the received field strength ceases to be exceeded.

Such field strength fluctuations occur, for example, upon the malfunction of a station or when an automobile radio is used during a trip. Circuits are known which eliminate these drawbacks but at an added cost which is so high that the circuits are not economical.

SUMMARY OF THE INVENTION

It is an object of the present invention to provide a circuit for automatic search tuning in radio receivers which eliminates the above-mentioned drawbacks through the use of simple means.

The present invention thus relates to a circuit in which the voltage of a capacitor, which has been charged via a transistor, serves to tune variable capacitance diodes. According to the present invention the control electrode of a transistor is connected to the output of a bistable circuit. The bistable circuit is switched into one state by the depression of a search key and into another state when a received signal has a field strength exceeding a predetermined threshold so that the transistor is then blocked, or nearly so, and the charged capacitor is kept at the desired voltage. when the transistor is blocked, a reduction in field strength can exert no influence on the charge level of the capacitor and therefore station lock-on is maintained.

In a further embodiment of the present invention with automatic fine tuning, a control electrode of the transistor is connected to the output of a control voltage generator in the form of a ratio detector, and whose output voltage is dependent on frequency deviation. The detector has an S shape characteristic so that the transistor recharges the capacitor to achieve automatic fine tuning.

In order to search in both directions across the broadcast band, a further embodiment of the present invention provides that the collector-emitter path of the charge transistor be connected in parallel with the charging capacitor, the charge transistor serving to slowly discharge the capacitor. The transistor has its base connected with the output of a second bistable circuit which is switched into one state by the depression of a return key and into the other state when a received signal exceeds a threshold level so tha the charge transistor is blocked or nearly so. The bistable circuit advantageously comprises a capacitor and a discharge transistor whose collector-emitter path is parallel to the capacitor and the output voltage of the bistable circuit is determined by the voltage of the capacitor, which has been charged upon the actuation of the search key or a return key. In order to simplify the circuitry required for selective reversal of the searching, a common charge transistor is provided for two bistable circuits, the common charge transistor being connected alternately with the capacitors of the bistable circuits.

DESCRIPTION OF THE PREFERRED EMBODIMENTS

Figure 1:
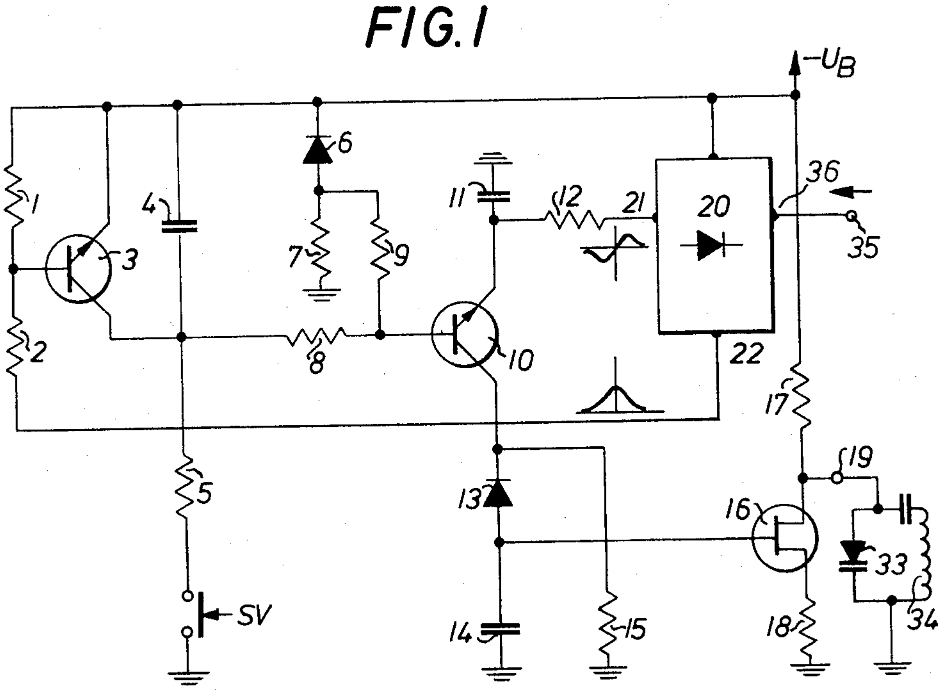
FIG. 1 is a schematic diagram of a circuit according to the invention with automatic fine tuning.

In the circuit shown in FIG. 1, capacitor 4 has one terminal connected directly to the operating voltage $-U_B$. By depression of the search key SV, search tuning forward is commenced in that the capacitor is charged through a resistor 5, whereby a potential of approximately 0 volts or ground, exists at the other terminal of capacitor 4 after the search tuning key has been released. This potential at the other terminal of capacitor 4 controls the base of driver transistor 10 via resistor 8 with a voltage which is positive compared to the operating voltage $-U_B$. The emitter of transistor 10 is connected, through a resistor 12, to the output 21 of a conventional ratio detector 20. The voltage appearing at output 21 has a d.c. component with an S-shaped characteristic which depends upon the frequency deviation of the ratio detector.

When the receiver is tuned over the broadcast band and a station is detected, a d.c. component with negative polarity with respect to the operating voltage $-U_B$ appears at the output 21 of the ratio detector 20. The d.c. component goes toward zero as the tuning becomes increasingly fine, after a negative maximum has been exceeded, the component being equal to zero when the tuning is accurate. The d.c. component exceeds a positive maximum during tuning to frequencies which are higher than the station's frequency. A low frequency voltage also appearing at the output 21 of the ratio detector 20 is short-circuited by capacitor 11 connected between ground and the emitter of transistor 10.

The input terminal 36 of the ratio detector 20 is connected to a terminal 35 to which is fed the signal received and amplified by the receiver. For tuning the receiver by a d.c. voltage which appears at the output terminal 19 there are provided one or more resonant circuits, e.g. the resonant circuit with the capacitance diode 33 and the coil 34.

At the beginning of search tuning, i.e. when no station is being received, the operating voltage $-U_B$ is present at the emitter of transistor 10. The presence of a control potential on the base of transistor 10 that is more positive than $-U_B$ switches the transistor into conduction. Resistors 8 and 9, through which capacitor 4 discharges after release of the search tuning key SV, are selected to have such resistance values that transistor 10 is controlled by a voltage that is sufficient for switching it to effect search tuning over the entire broadcast band. The current flowing through transistor 10 also flows through diode 13 which is biased to pass this current and charges a storage device in the form of the capacitor 14 with an almost constant current so that an increasing voltage is produced across this capacitor 14. The increasing voltage signal is transmitted to output terminal 19 via a buffer amplifier representing a high resistance load comprising field effect transistor 16 and resistors 17 and 18. The voltage at output terminal 19 serves to tune the variable capacitance diode 33 which forms a resonant circuit with coil 34. Connected in series with coil 34 is a d.c. blocking capacitor.

The charging of capacitor 14 must not be interrupted until a station available for reception, i.e. a station providing a sufficient field strength, is received. The interruption of the charging process is made by a transistor 3 which has its collector-emitter connected in parallel with capacitor 4. This is done in the following manner: The voltage divider consisting of resistors 1 and 2 has a tap-off which determines the base voltage for transistor 3. The end terminals of the divider are connected between the lead for the operating voltage $-U_B$, and output 22 of ratio detector 20. At output 22, a d.c. component appears which has a positive maximum with respect to the operating voltage $-U_B$, dependent upon field strength, when tuning to a station's frequency. If the received field strength exceeds a minimum value which is determined by the voltage divider consisting of resistors 1 and 2, transistor 3 is switched into conduction and capacitor 4 is rapidly discharged. The voltage at the base of transistor 10 is now determined by the voltage of diode 6 which is biased forwardly by the resistor network 7, 8, 9. In this way a voltage is applied to the base of transistor 10 which is positive with respect to the operating voltage $-U_B$ to such an extent that the voltage at the emitter, whose value lies in the region of the operating voltage $-U_B$, can block or open the transistor with a fixed base voltage.

The capacitor 4 and connected transistor 3 form a bistable or switchable control circuit. Since the field strength dependent voltage at the output 22 of ratio detector 20 switches the bistable circuit even before fine tuning to the station's frequency, the capacitor 14 must be recharged for the fine tuning operation. Automatic fine tuning for recharging the capacitor 14 is provided by the above-described control of transistor 10 at its emitter. The voltage at output 21 of the ratio detector 20 is negative with reference to the operating voltage $-U_B$ during tuning to a frequency which is lower than a received station's frequency. Under such circumstances transistor 10 still conducts some current at its base in spite of the blocking voltage produced by the discharge of capacitor 4 so that capacitor 14 is charged further. Only during tuning to the station's frequency or a frequency which lies very near the station's frequency is the transistor 10 controlled to the blocked state at its emitter.

Transistor 10 is steered back into the conducting state when renewed actuation of the search tuning key SV initiates the search for a station other than the one being received. In this case capacitor 4 is charged and transistor 10 becomes conductive thereby renewing switching of the bistable circuit.

When transistor 10 is blocking, in order to prevent the residual current, which cannot be neglected in some types of transistors, from further charging capacitor 14 in an undesired manner, a resistor 15 is connected in parallel with the series connection of diode 13 and capacitor 14. Collector current from transistor 10 which flows through resistor 15 produces a voltage drop across the resistor 15 which becomes lower with decreasing current until diode 13 is finally blocked.

The bistable circuit comprising transistor 3 and capacitor 4 is switched upon reaching a threshold input derived from the received field strength. As a result, the transistor 10 is almost blocked at its base and it is impossible for capacitor 14 to be charged to a voltage which would signify a tuning of the receiver to a frequency above the frequency range in which the automatic fine tuning operates. Automatic fine tuning by controlling transistor 10 at its emitter recharges capacitor 14 only after it has been tuned to a frequency which is lower than the station's frequency which would be the case when capacitor 14 is discharged. This is avoided, however, by the high-ohmic load of a field effect transistor 16. In this way the circuitry prevents the loss of station lock-on when the received field strength decreases or is momentarily absent. Otherwise, search tuning would continue. The high-ohmic load across capacitor 14 from field effect transistor 16 assures that the voltage across capacitor 14 is not significantly changed even when the station is totally lost.

If, during automatic search tuning, no station is found which can be received, and capacitor 14 is charged to the highest possible voltage, or if the search tuning passes to the end of the tuning range due to actuation of the search tuning key SV, capacitor 14 can subsequently be discharged in a known manner by a shorting switch (not shown). Thus, the rest position of the search tuning is at the lower end of the broadcast band. At the same time it is possible in this way to switch the search tuning circuit at any time during the search tuning so that the search begins at the beginning again, i.e. with tuning commencing at the lowest frequency in the broadcast band. It is also possible to automatically discharge capacitor 14 in a known manner by means of an additional circuit (not shown) when the upper end of the tuning range has been reached. Such a discharge technique would employ an auxiliary transistor connected in parallel with capacitor 14.

Figure 2:
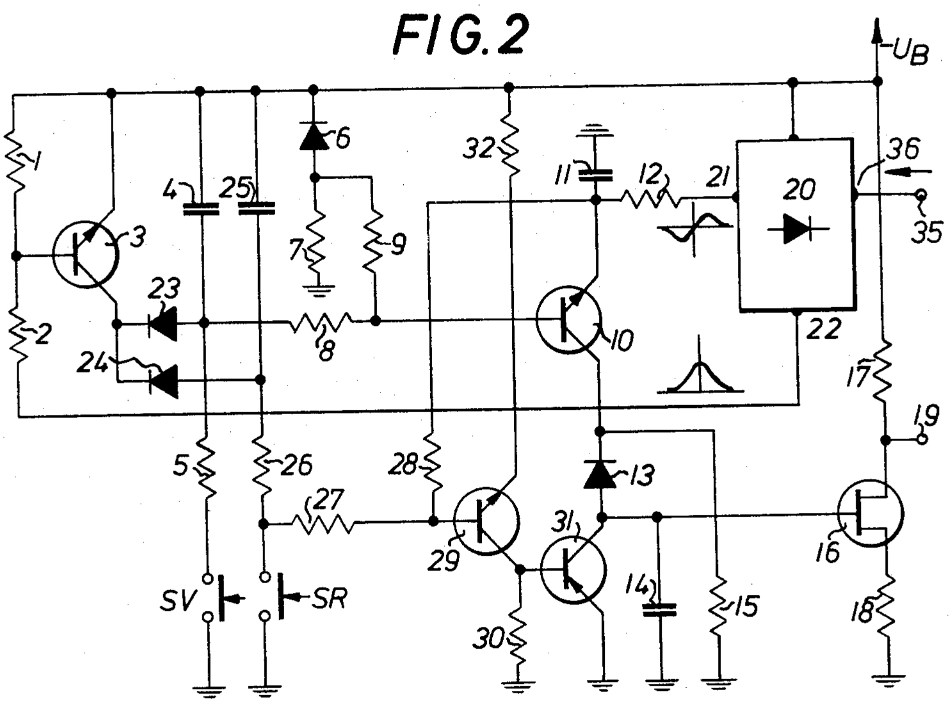
FIG. 2 is a diagram of another embodiment of a circuit according to the invention with automatic fine tuning and selective reversal of the search tuning.

FIG. 2 shows a circuit with automatic fine tuning according to FIG. 1 with an additional feature for selective reversal of the search tuning. The individual components of FIG. 2 correspond in function and operation to those with the identical reference numerals of FIG. 1. However, in contradistinction to the circuit of FIG. 1, the circuit of FIG. 2 offers the possibility of effecting the search tuning in both directions, i.e. toward higher frequencies or toward lower frequencies.

If after receipt of a program, a new station of lower frequency is selected, the return key SR (search tuning in reverse) is depressed. This closes a charging current path including a capacitor 25 and a resistor 26 in a manner previously discussed in connection with capacitor 4 of FIG. 1. As long as return key SR is depressed, ground potential is applied to the base of transistor 29 through resistor 27. After releasing key SR, the voltage of capacitor 25 controls the base of transistor 29 via resistors 26 and 27. In both cases transistor 29 conducts because the emitter of the transistor is connected to operating voltage $-U_B$ via resistor 32 and the transistor collector is connected to ground via resistor 30. The voltage drop resulting at resistor 30 controls the base of load transistor 31 whose collector-emitter path is connected in parallel with capacitor 14 thus rendering transistor 31 conductive. In this way capacitor 14 is discharged and the tuning voltage drops at the output 19 of the circuit. If during search tuning in the reverse direction the tuning approaches a station with a sufficient field strength, the output 22 of the ratio detector 20 steers transistor 3 into conduction according to the circuit of FIG. 1 as explained previously. This causes capacitor 25 to discharge. Thus, the voltage at the base of transistor 29 becomes negative to such an extent that transistor 29 is almost blocked. After switching of the bistable circuit comprising transistor 3 and capacitor 25, the base voltage of transistor 29 is determined by the voltage divider consisting of resistors 26, 27, 28 and 12, which is tapped so that transistor 29 and thus also transistor 31 are blocked entirely, only when the d.c. component of the voltage at output 21 of the ratio detector 20 has become equal to zero, or almost zero after exceeding the positive maximum with respect to the operating voltage $-U_B$. Only then is the discharge process interrupted.

Diodes 23 and 24 are required to decouple the two capacitors 4 and 25.

It will be understood that the above description of the present invention is susceptible to various modifications, changes and adaptations, and the same are intended to be comprehended within the meaning and range of equivalents of the appended claims.

I claim:

1. In an automatic search tuning circuit for tuning the tunable capacitance diode of the resonant circuit of a radio receiver, the search tuning circuit including a capacitor means for providing an output signal for tuning the tunable capacitance diode, said capacitor means being well insulated to prevent loss of the charge thereon, an electronic switching means having an output connected to the capacitor means for providing a signal for charging the capacitor means, a control voltage generator means for producing a first output voltage signal at a first output when a signal received by the radio receiver exceeds a minimum value of field intensity, a first switchable control means having its output connected to a first input of the electronic switching means, a search tuning actuator means connected to the first switchable control means for switching it into a first state and means for connecting the first output of the control voltage generator means to the first switchable control means for switching it into a second state, the improvement wherein said first switchable control means produces an output signal sufficient to fully drive said electronic switching means only when in its first state, said control voltage generator means produces, at a second output, a second output voltage which is S-shaped in dependence on the frequency deviation of the radio receiver and said electronic switching means includes a first transistor having first and second control electrodes, said first control electrode constituting said first input of said electronic switching means connected to the output of said first switchable control means and said second control electrode being connected to said second output of said control voltage generator means for driving said first transistor so as to continue to charge said capacitor means for effecting automatic fine tuning.

2. A circuit as defined in claim 1 wherein said first switchable control means includes a second capacitor and a third transistor having its collector-emitter path connected in parallel with said second capacitor, a charging circuit connected to said second capacitor for charging said second capacitor to a predetermined voltage level upon actuation of said search tuning actuator means thereby switching said first switchable control means into its first state; the voltage across said second capacitor constituting the output signal of said first switchable control means; the first output of said control voltage generator means is connected to said first switchable control means via the base electrode of said third transistor for actuating said third transistor so as to enable said second capacitor to be discharged.

3. A circuit as defined in claim 1 wherein said control voltage generator means includes a ratio detector for producing the second output signal having an S-shape.

4. A circuit as defined in claim 1 further comprising: a reverse search tuning actuator means; a second switchable control means; a second transistor having its collector-emitter path connected in parallel with said capacitor means for slowly discharging the signal across said capacitor means and having its base electrode connected with the output of said second switchable control means; said reverse search tuning actuator means being connected to said second switchable control means for switching it into a first state; means for connecting the first output signal of said control voltage generator means to said second switchable control means for switching said second switchable control means into a second state; and said second switchable control means produces an output sufficient to fully drive said second transistor only when in its first state.

5. A circuit as defined in claim 4 wherein each of said first and second switchable control means includes a respective second capacitor and a decoupling diode and both of said first and second switchable control means include a common third transistor having its collector-emitter path connected in parallel with each of said second capacitors via said respective decoupling diode, a charging circuit connected to both of said second capacitors for charging a respective one of said second capacitors to a predetermined voltage level upon actuation of said search tuning actuator and said reverse search tuning actuator, respectively, thereby switching said first and second switchable control means, respectively, into their first state; the voltage across each of said second capacitors constituting the respective output signals of said first and second switchable control means; the first output of said control voltage generator means is connected to said switchable control means via the base electrode of said third transistor for actuating said third transistor so as to enable said second capacitors to be discharged.

6. A circuit as defined in claim 4 wherein the base electrode of said second transistor is connected to the second output of said control voltage generator means for driving said second transistor so as to continue to discharge said capacitor means to effect automatic fine tuning of the tunable capacitance diodes.

* * * * *